Nov. 15, 1966 J. K. SKILLING 3,286,199
TRANSISTOR-CONTROLLED OSCILLATOR APPARATUS
Filed June 30, 1965
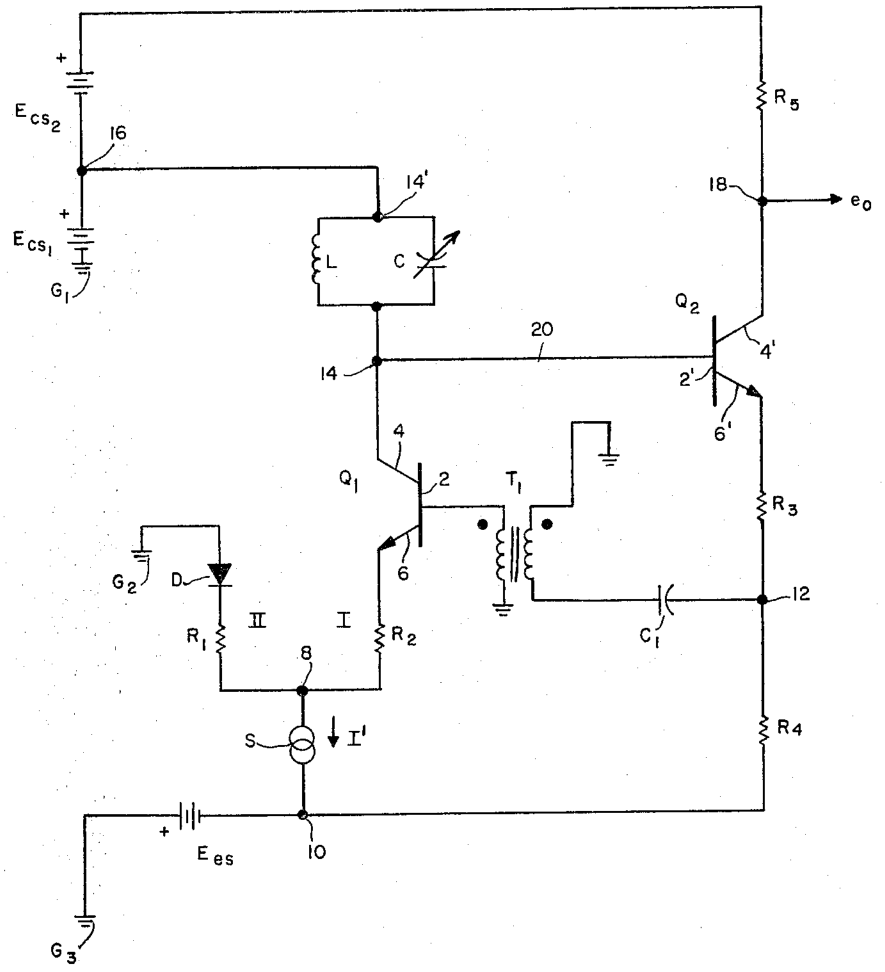
INVENTOR.
JAMES K. SKILLING
BY Rines and Rines
ATTORNEYS United States Patent Office 3,286,199
Patented Nov. 15, 1966

3,286,199
TRANSISTOR-CONTROLLED OSCILLATOR APPARATUS

James K. Skilling, Harvard, Mass., assignor to General Radio Company, West Concord, Mass., a corporation of Massachusetts Filed June 30, 1965, Ser. No. 468,277
14 Claims. (Cl. 331—117)

The present invention relates to electronically controlled oscillator circuits, being more specifically directed to preferably substantially sinusoidal wave-form-generating oscillators controllable by transistor and semi-conductor relay or related solid-state and other devices (all hereinafter generically termed "transistor" means).

Many transistor and related devices of the above-described character are effective as on-off switching relays, producing, in response to such switching phenomena, substantially square-wave output currents, and that, while eminently suitable for the generation of pulses and the like, are inherently not susceptible, when operated in switching modes, to the generation of substantially sinusoidal wave forms. It is, accordingly, to the solution of the problem of rendering such switching devices adaptable for controlling the generation of substantially sinusoidal wave oscillations that the present invention is principally directed.

A further object of the invention is to provide a new and improved oscillator circuit.

Other and further objects will be pointed out hereinafter, being more particularly set forth in the appended claims. In summary, the invention employs a switching relay in one of a pair of paths connected in common with a source of current, a tank circuit being connected with the switching relay in the said one path and being provided with a feedback connection for rendering the switching relay conductive synchronously with the tank circuit resonant-frequency oscillations, periodically to cause the said paths alternately to pass current from the source; the switching relay, when thus rendered conductive, feeding at least a component of the said resonant-frequency oscillations to the tank circuit along the said one path to sustain resonant-frequency substantially sinusoidal voltage oscillations therein. Preferred constructional details are hereinafter set forth.

The invention will now be described in conjunction with the accompanying drawing, the single figure of which is a schematic circuit diagram of a preferred embodiment illustrating the underlying principles of the invention.

Referring to the drawing, any desired current source S is shown connected at terminal 8 to a pair of current paths I and II embodying respective uni-directional switching devices, shown for illustrative purposes, as a transistor amplifier $Q_1$, and a semi-conductor or similar diode D, respectively. Path II contains a resistance element $R_1$ connected in series with the diode D to a reference terminal, illustrated as a ground $G_2$. Path I also contains a resistor $R_2$ in series with the emitter electrode 6 of the transistor $Q_1$, the path continuing when the transistor conducts, from the collector electrode 4 thereof to the lower terminal 14 of a tank circuit LC, tunable to the desired resonant frequency of the voltage oscillations to be generated.

A feedback connection is provided at 20, preferably from the lower tank circuit terminal 14, through a transistor emitter-follower stage $Q_2$ via coupling (and D.C. blocking) capacitor $C_1$ and an inverting transformer $T_1$, to the base 2 of the transistor switching relay $Q_1$ in the path I. The stage $Q_2$ embodies respective base, collector and emitter electrodes 2′, 4′, and 6′, the latter of which is connected in its output circuit through a voltage divider network comprising resistors $R_3$ and $R_4$ to the lower terminal 10 of the source S, and thence through an emitter voltage supply source $E_{ES}$ to ground at $G_3$. The coupling capacitor $C_1$ is connected between voltage divider resistors $R_3$ and $R_4$ to terminal 12. Large resonant-frequency sinusoidal voltage-oscillation swings developed across the tank circuit LC and applied at 20 to the base 2′ in the input circuit of the emitter-follower stage $Q_2$ thus drive the transformer $T_1$ with a lesser amplitude voltage equal to $R_4/(R_3+R_4)$ times the resonant circuit voltage, typically of the order of about three volts, peak-to-peak. Transformer $T_1$ (with its primary connected to terminal 12 and its secondary connected to the base 2) may have a one-to-one turns ratio and may, of course, be replaced by any other desired well-known inverting stage or device, though its simplicity commends it for the present purposes.

The large signal thus applied to the base 2 of transistor $Q_1$ causes the emitter current I′ thereof effectively to switch between transistor $Q_1$ in path I and the diode D in path II, resulting in a square-wave of collector current at 4, particularly in view of the preferred over-driving of $Q_1$ during its periods of conduction, controlled by the feedback path 20–$Q_2$–$C_1$–$T_1$, synchronously with the tank circuit oscillation frequency. Since the square-wave of collector current flowing into tank circuit terminal 14 in path I represents a component of the tank circuit oscillation frequency current, it has been found effectively to sustain sinusoidal voltage oscillations across the tank circuit LC at its adjusted resonant frequency. The values of resistors $R_1$, $R_2$, $R_3$ and $R_4$ may be selected to control the gain and impedance levels of the oscillator, and the sinusoidal output voltage thereof, extractable at $e_0$ from the junction of emitter-follower collector 4′ and resistor $R_5$, may have its amplitude controlled approximately by the selected resistance ratio $R_5/(R_3+R_4)$ times the resonant circuit voltage across LC.

The collector 4′ is shown receiving its supply voltage through resistor $R_5$ from the source $E_{CS_2}$, which is, in turn, series-connected at 16 with the collector potential supply source $E_{CS_1}$ for the collector 4 of switching relay $Q_1$. The supply circuit for the collector 4 is traceable from the ground terminal $G_1$ of source $E_{CS_1}$ to point 16, thence to the upper terminal 14′ of tank circuit LC, through the inductance L thereof and terminal 14, to the collector 4.

The amplitude of the LC resonant-frequency oscillator voltage and hence the sinusoidal output voltage at $e_0$, is proportional to the previously mentioned current I′ and thus may be set simply by a resistor (as at 10, not shown) connected to the negative supply voltage source $E_{ES}$.

If automatic gain control action is desired, any well-known active current source (not shown) the current of which is proportional to the rectified tank circuit voltage may be used. Further modifications will also occur to those skilled in the art, including other tank circuit configurations and other types of switching relay devices and circuits, without departing from the spirit and scope of the invention as defined in the appended claims.

What is claimed is:

1. An oscillator apparatus having, in combination, a source of current connected to each of a pair of paths at least one of which comprises a switching relay, a tank circuit connected to the switching relay in the said one path, means for feeding back resonant-frequency voltage oscillations from the tank circuit to the switching relay to render the same synchronously periodically conductive at such frequency in the said one switching path, thereby to cause the said paths alternately to pass current from the said source, the switching relay when thus rendered conductive feeding at least a component of the said resonant-frequency oscillations to the tank circuit along the said one path to sustain resonant-frequency substantially sinusoidal voltage oscillations therein, and means for extracting the said oscillations from the tank circuit.

2. Apparatus as claimed in claim 1 and in which means is provided for over-driving the said switching relay during the periods of its being rendered conductive to produce a substantally square wave comprising the said component.

3. Apparatus as claimed in claim 1 and in which the said switching relay connected in the said one path comprises transistor means and the other path of the said pair of paths contains diode means.

4. Apparatus as claimed in claim 3 and in which the said feeding back means comprises an emitter-follower transistor stage having an input and output the former of which is connected to the tank circuit and the latter of which is connected by inverting means to the said transistor means.

5. Apparatus as claimed in claim 3 and in which the said transistor means is provided with base, collector and emitter electrodes, the latter two of which are connected in the said one path with the base electrode connected with the said feeding back means.

6. Apparatus as claimed in claim 5 and in which the said feeding back means comprises an emitter-follower transistor stage having an input and output the former of which is connected to the tank circuit and the latter of which is connected by inverting means to the said base electrode.

7. Apparatus as claimed in claim 6 and in which the connection of the emitter-follower stage input to the tank circuit connects also to the said collector electrode.

8. Apparatus as claimed in claim 7 and in which the said inverting means comprises transformer means the primary of which connects with the said emitter-follower output and the secondary of which connects with the said base electrode.

9. Apparatus as claimed in claim 7 and in which means is provided for over-driving the said transistor means to produce a substantially square-wave output at the said collector electrode thereof.

10. Apparatus as claimed in claim 9 and in which voltage divider means is provided in the said emitter-follower stage output for causing the voltage oscillations applied to the said base electrode to be of lesser amplitude than those present at the tank circuit.

11. Apparatus as claimed in claim 10 and in which the emitter-follower stage comprises base, collector and emitter electrodes, the base electrode of which is connected to the connection between the said transistor means collector electrode and one terminal of the said tank circuit, the emitter-follower collector electrode being connected to the said oscillation-extracting means and through resistance to a first source of collector voltage and thence to the other terminal of the tank circuit, the said first source of collector voltage being connected to a second source of collector voltage for the said transistor means, and the emitter-follower emitter electrode being connected through the said voltage divider means to the said source of current and emitter supply voltage means.

12. Apparatus as claimed in claim 11 and in which each of the said second source of collector voltage, the emitter supply voltage means and the said diode means are connected to a reference terminal such as ground.

13. Apparatus as claimed in claim 12 and in which the said source of current is connected between the said emitter supply voltage means and a terminal common to each of the said paths, and thence via resistive means to the transistor means emitter electrode in one path and the said diode means in the other of the said pair of paths.

14. Apparatus as claimed in claim 1 and in which means is provided cooperative with the said feeding back means for causing the voltage oscillations fed to the said switching relay to be of lesser amplitude than those present at the tank circuit.

No references cited.

ROY LAKE, *Primary Examiner.*

J. KOMINSKI, *Assistant Examiner.*